United States Patent [19]

Cedrone et al.

[11] Patent Number: 4,473,798
[45] Date of Patent: Sep. 25, 1984

[54] INTERFACE ASSEMBLY FOR TESTING INTEGRATED CIRCUIT DEVICES

[75] Inventors: Nicholas J. Cedrone, Wellesley Hills; Kenneth R. Lee, Lincoln, both of Mass.

[73] Assignee: Daymarc Corporation, Waltham, Mass.

[21] Appl. No.: 325,314

[22] Filed: Nov. 27, 1981

Related U.S. Application Data

[63] Continuation-in-part of Ser. No. 296,234, Aug. 25, 1981, Pat. No. 4,419,626.

[51] Int. Cl.$^3$ .......................... G01R 1/06; G01R 31/02
[52] U.S. Cl. .................................. 324/158 P; 307/89; 324/72.5; 324/158 F; 339/108 TP
[58] Field of Search ............... 324/158 P, 158 F, 72.5; 339/108 TP; 307/89; 333/12

[56] References Cited

U.S. PATENT DOCUMENTS

| | | | |
|---|---|---|---|
| 3,702,439 | 11/1972 | McGahey et al. | 324/158 P |
| 3,832,632 | 8/1974 | Ardezzone | 324/158 P |
| 4,055,800 | 10/1977 | Fisk et al. | 324/158 P |
| 4,068,170 | 1/1978 | Chayka et al. | 324/72.5 |
| 4,177,425 | 12/1979 | Lenz | 324/158 P |

*Primary Examiner*—Stewart J. Levy
*Attorney, Agent, or Firm*—Kenway & Jenney

[57] ABSTRACT

Disclosed is an interface assembly for use in conjunction with a test contactor assembly for integrated circuit (IC) electronic devices and the like. The test contactor assembly has at least one row of flexible contacts that are each secured at a lower end to a base. A conductive plate is also secured to the base and extends in a generally parallel, closely spaced relationship to each row of contacts. The dimensions of the plate and its spacing from the associated contacts produce a distributed capacitance with respect to each contact in the row such that a fast-rising test signal launched in a contact encounters a generally "characteristic" or purely resistive impedance that is frequency independent. The interface assembly, which connects the test contactor assembly to a test circuit, has a contactor board secured to the base of the contactor assembly. A pattern of conductive stripes is carried on at least one face of the board. Elastomeric connectors with narrow, mutually spaced apart conductive filaments, each oriented generally transversely to the connector, electrically connect the stripes with the contacts and plates of the contactor assembly. The interface assembly is secured to the test contactor assembly to establish a unique electrical connection between each conductive stripe and an associated contact or plate. The contactor board can include an internal metallic layer that serves as a ground and provides a distributed capacitance for the conductive stripes.

11 Claims, 12 Drawing Figures

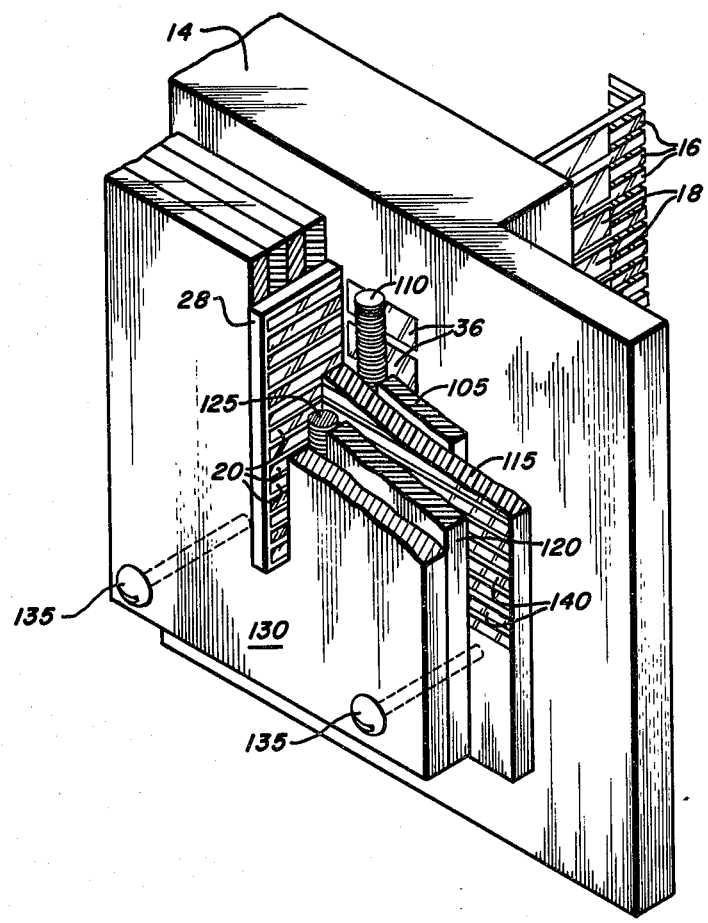
FIG. 9
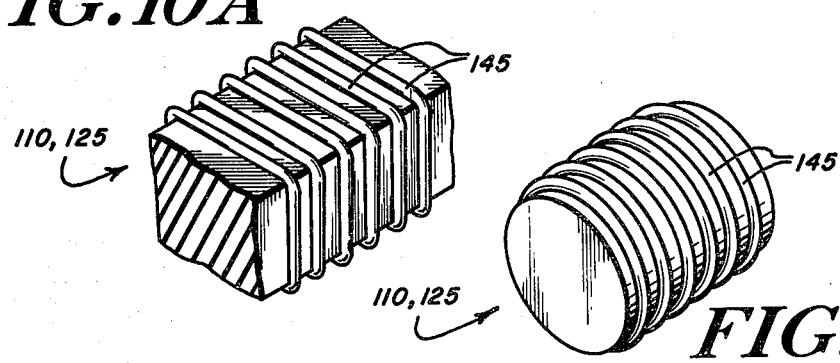
FIG. 10A
FIG. 10B

INTERFACE ASSEMBLY FOR TESTING INTEGRATED CIRCUIT DEVICES

REFERENCE TO RELATED APPLICATIONS

This application is a continuation-in-part of copending U.S. application Ser. No. 296,234 filed Aug. 25, 1981 now U.S. Pat. No. 4,419,626 entitled Broad Band Contactor Assembly for Testing Integrated Circuit Devices, the disclosure which is incorporated herein by reference.

BACKGROUND OF THE INVENTION

This invention relates in general to testing apparatus for electronic devices. More specifically it relates to a contactor assembly that is generally frequency insensitive to allow broad band testing with fast-rising signals and to an interface assembly for connecting such a contactor assembly to testing circuitry.

In the manufacture and use of integrated circuits (IC's) and similar electronic devices it is important to test the devices accurately, reliably and at a high rate. Automatic testing and handling apparatus machines that can perform this task are available. Such apparatus suitable for testing dual-in-line packaged (DIP) IC's are sold by the Daymarc Corporation, Waltham, Massachusetts, under the trade designation Type 1156 and 1157. In a DIP device, the circuit is contained in a molded plastic body having a generally rectangular, box-like configuration. Two rows of generally parallel connecting ends are arrayed along parallel sides of the body with each pin extending in a direction generally normal to the main faces of the body.

In each of the aforementioned apparatuses the IC's are momentarily brought to rest at a test station where a set of contacts, typically double Kelvin contacts, are flexed through a cam action into electrical connection with the pins of the device. The contacts establish an electrical connection between testing circuitry and the device. The contacts are usually part of a probe or contactor assembly which includes an insulating base member that mounts the contacts. The contacts are typically narrow strips of a resilient and highly conductive material. The contacts typically make electrical connection with an associated connecting pin at a free end opposite the base. The cross-sectional dimensions of the contacts are relatively small due to (1) the requirement that all of the contacts simultaneously make connection a set of closely packed pins and (2) the requirement that the contacts flex for millions of cycles of operation without material fatigue. The length of the contacts is determined by the spacing between the test station of the IC handling apparatus and the test circuitry.

Frequently the testing of the integrated circuits requires that the testing signal be "fast-rising", that is, a signal which is a very steep, step-like increase in potential. A typical fast-rising signal is characterized by a voltage change of 5 volts per nanosecond. Such a signal can be represented through Fourier analysis as being composed of a multitude of superimposed sine waves having a very high frequency, typically on the order of 300 mHz. The fast-rising signal launched by the test circuitry and carried by the contacts to the device therefore contains componenets with very high frequencies.

A major problem with this testing arrangement is that due to the inherent inductance of the contacts themselves, the signal encounters an inductive reactance $X_L$. This reactance produces distortions and reflections which degrade the quality and accuracy of the test. The inductance L of the contact is a function of the cross-sectional area of the conductor and its length. It increases directly with the length and inversely with the cross-sectional area. Since the inductive reactance $X_L = 2\pi fL$, for the very high frequencies f associated with a fast-rising signal, the inductive reactance associated with even the relatively short contacts in normal use becomes a significant source of distortion and limits the accuracy of measurements.

One possible solution would be to increase the cross-sectional area of the contacts. However, the physical constraints of the test environment limit the useful dimensions of the contacts. For example, the contacts must be separated laterally from adjacent contacts while still maintaining a unique association with one pin on the IC. Also, the contacts must be sufficiently thin to flex repeatedly without exhibiting fatigue. Another possible solution is to make the contacts shorter. This solution works well if the IC can be placed manually into the test circuit. However, with high speed automated operation (e.g. 6,000 units per hour), the test circuitry must be physically separated from the device handling mechanisms with electrical connection made over some short distance spanned by a probe or contactor assembly of the type described above. In short, modern production economics require contacts having a length which is troublesome for fast-rising signals. Another solution is surrounding each contact with a shield in the manner of a coaxial cable. The shield, however, would interfere with the flexure of the enclosed contact. Still another possible solution is simply to test each device more slowly to wait for distortions and reflections to die out. With many modern IC's however, the speed of operation of the device itself is so fast that if the testing operation were to extend over a sufficient period of time to allow distortions and echoes induced by the fast-rising testing signal to subside, then the speed rating of the devices cannot be determined. In short, the testing operation must have a speed comparable to that of the device function being tested. At present, there is no known contactor assembly for use with automated IC testing and handling apparatus which can provide a reliable electrical connection between the IC device and the testing circuitry while at the same time avoiding the distortions, reflections and the resulting uncertainty of the measurement when the IC is tested with fast-rising signals.

Another consideration is minimizing "ground noise", that is, changes in the reference voltage due to current surges during the test procedure simulating operation of the device. A typical situation is a test where a change in the device state causes a current surge in the range of 20 milliamperes per nanosecond. Such a surge can cause the ground reference to move 1 volt or more thereby distorting measurements referenced to ground by 20% or more. The end result is that good devices may not pass the test and are downgraded.

Another problem with testing apparatuses for electronic devices exists in the way the probe or contactor assemblies are connected to a test circuit. When there is a high density of electrical contacts in a confined area, it is difficult to make connections with the testing circuitry while maintaining signal fidelity. The aforementioned distortion and reflection problems are important design considerations. Previously, each contact of a test contactor assembly was electrically connected to a test circuit by a set of wires carried on a mounting board and soldered to the desired connection points. This "hard" wiring involves increased production time due to the inherent difficulty in making numerous permanent electrical connections in a highly limited area. It also means that each contact assembly and an associated test circuit board became a single assembly. As a result, to accommodate different IC's it was necessary to replace the entire testing assembly. Also, with hard wiring the performance of the assembly varies with the skill of the person performing the wiring. This situation reduces the dependability of the assembly.

It is therefore a principal object of the invention is to provide an interface assembly between a test circuit and a contactor assembly which provides a high density of electrical contacts in a confined area and which is characterized by excellent signal transmission characteristics for a fast-rising test signal.

Another object of the invention is to provide an interface assembly that allows a convenient replacement of the contactor assembly and/or the test circuit thereby providing enhanced operational flexibility and reducing the required inventory of test components.

Yet another object of the invention is to provide an interface device with the foregoing advantages that requires no critical alignments to establish the necessary unique electrical connection between the test circuitry and the contacts or other components of the contactor assembly.

Still another object is to provide an interface assembly with the foregoing advantages that transmits fast-rising signals with a substantially characteristic impedance.

A further object of the invention is to provide a testing apparatus with a comparatively short path length from the electronic device being tested to the test circuit.

A still further object of the invention is to provide an interface assembly with the foregoing advantages that has a generally simple, low cost, and highly durable construction.

SUMMARY OF THE INVENTION

A contactor assembly for electronic devices, particularly dual-in-line packaged (DIP) IC's with two parallel rows of connecting pins, has a base that supports at least one row of resilient electrical contacts secured at their lower end to the base and extending generally perpendicular to the base to a free end. Typically the free end is angled toward an associated pin to make electrical connection with the pin when the contact is flexed toward the device. Each contact has a small cross section and is designed to conduct an electrical signal along its length between test circuitry and the device. Each contact is structured to flex resiliently from a first non-testing position where the free end of the contact is spaced from the associated pin to a second testing position where the free end is forced into electrical connection with the pin. The lower ends of each contact preferably extend through and below the base where they make electrical connection to an interface assembly.

The base also supports a conductive plate associated with and oriented in a generally parallel, closely spaced relationship with respect to each row of the contacts. The spacing is preferably uniform. In the preferred form, the plate is continuous and extends substantially the full length of the associated row. The plate is also preferably secured at one edge to the base and is resilient. The dimensions and spacing of the plate produce a distributed capacitance as seen by a signal transmitted along the contacts. The value of the resulting capacitive reactance substantially offsets the conductive reactance produced by the self inductance of the contacts. As a result, a fast-rising signal launched in a contact encounters a substantially characteristic impedance. Stated in other terms, the contactor assembly is substantially frequency independent and therefore capable of operating over a broad band. The plate also extends through and below the base where it also makes electrical connection with the interface assembly.

The contactor assembly preferably includes a layer of flexible insulating material which is inserted between each of the upstanding plates and the associated row of contacts. The insulating layer maintains the desired dimensional separation between the plate and the associated contacts through the flexural movement of the contacts into and out of electrical connection with the pins. Also in the preferred form, the value of the characteristic impedance is generally in the range of 50 to 100 ohms.

Another feature of the contactor assembly is that at least one plate is located generally between the associated row of contacts and the device being tested. This "inner" plate carries a contact element structured and located to make electrical connection with one of the pins. In a preferred form of the invention adapted for use with devices having two parallel rows of pins, there are two such "inner" plates that make electrical connection with two different pins of the device. These plates and contacts provide a means located close to the IC for applying a large test current surge to it. The dimensions of the plates present a low inductance. One inner plate is connected to a source of a large current surge; the other plate is connected to ground. Both inner plates are connected to one another through a small capacitor that can be located either above or below the base.

The interface assembly connects the test contactor assembly to a test circuit. The assembly includes a contactor board with a pattern of conductive stripes formed on at least one of its faces. Elastomeric connectors make electrical connection between the conductive stripes and associated contacts or plates of the contactor assembly. Each elastomeric member is elongated and carries a series of narrow conductive filaments on its outer surface. The strips are mutually spaced from one another and oriented generally perpendicular to the longitudinal axis of the elastomeric member. Each elastomeric connector establishes a unique electrical connection between a conductive stripe on the contactor board and an associated contact or plate of the contactor assembly.

In the preferred form, the assembly includes two connector frames with openings structured to receive the elastomeric connectors and the lower ends of the contacts. One frame is located between the contactor board and the base of the test contactor assembly and the other is located below the contactor board. These connector frames locate and fix the elastomeric connectors with respect to both the conductive stripes on the contactor board and the contacts or plates of the contact assembly. The frames themselves are fixed in a preselected spatial relationship with respect to the contactor assembly and the contactor board. Clamp means, such as a set of screws, secures the component elements of the interface device to the contactor assembly and to one another with a sufficient force to establish a reliable electrical connection between the conductive stripes on the board, the conductive filaments, and the conductive members of the contactor assembly. Preferably the dimensions of the elastomeric connectors and the connector frames is such that the clamping squeezes the elastomeric members into a reliable electrical connection with adjoining conductive members. The frames are formed of a substantially rigid material and have a thickness that controls the degree of "deflection" of the elastomeric connector during the clamping. The deflection of the connectors establishes the electrical connection mentioned above while preserving the structural integrity of the conductive filaments.

Also in the preferred form, the contactor board contains at least one internal conductive path in the form of a metallic layer sandwiched in the contactor board. This layer is preferably positioned to establish a distributed capacitance with respect to the conductive stripes such that a fast rising signal transmitted along the conductive stripes encounters a generally characteristic impedance. The contactor board can include plated-through hole or holes extending from the top and/or bottom of the contactor board to the internal metallic layer to establish an electrical connection between the layer and one or more conductive stripes.

These and other features and objects of the invention will be more clearly understood from the following detailed description of the preferred embodiments which should be read in light of the accompanying drawings.

BRIEF DESCRIPTION OF THE DRAWINGS

FIG. 9 is an isometric view of the interface assembly shown in FIGS. 7 and 8 with parts broken away to show the interior of the interface assembly;

FIGS. 10A and 10B are perspective views of two different embodiments of elastomeric connectors used in the interface assembly shown in FIGS. 7-9.

DETAILED DESCRIPTION OF THE PREFERRED EMBODIMENTS

Figure 2:
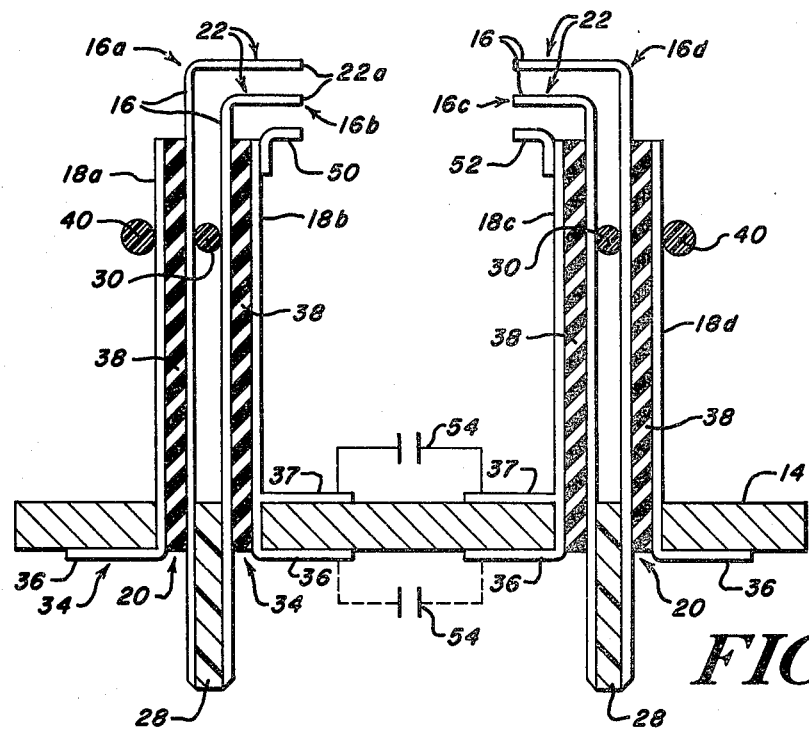
FIG. 2 is a view in vertical cross section of the contactor assembly shown in FIG. 1.

FIGS. 1-4 show a test contactor assembly 12 that has a base 14, four rows 16a, 16b, 16c and 16d of contacts 16, and a set of capacitive plates 18a, 18b, 18c and 18d that will be referred to collectively as plates 18. For the purpose of this description the base is taken as being horizontally oriented. It is also insulating and has a generally plate-like configuration. Each plate 18 is associated with one of the rows of contacts. Each contact 16 has a lower end 20 that is secured in the base 14 and extends to a free or upper end 22 that is angled toward an associated pin 24 of an integrated circuit device 26. The cross section of each contact 16 is preferably generally rectangular with the broad face of each contact parallel to the pins 24. As shown, the contacts in the rows 16a and 16b are arranged in Kelvin pairs with two contacts, 16' from the row 16b and 16" from the row 16a, adapted to make electrical connection with the same pin 24 at the same time. The contact 16" from the "outer" row 16a (the one more distant from the device) generally surrounds the contact 16 with the free end of the contact 16" overlying the free end 22 of the contact 16. Similarly, one contact from the row 16c and an associated, "overlying" contact from the row 16d form a Kelvin pair that makes an electrical connection with a pin on the opposite side of device 26. The pairs of contacts in the rows 16a and 16b are generally opposed to a like set of pairs of contacts in the rows 16c and 16d which allows the contact assembly 12 to make a reliably electrical connection to all of the pins of a DIP IC 26 of the type shown in FIGS. 3 and 4. The contacts in the rows 16a ... 16d are generally parallel to one another and to the rows of connecting pins 24 of the device 26.

The lower ends 20 of the paired contacts are spaced by insulating strips 28,28. In their normal unflexed position shown in FIGS. 1 and 2 the contacts are generally perpendicular to the base 14. In this position the ends 22 of the contacts are spaced from the pins 24. Besides being formed of a highly conductive material, the contacts 16 are also formed of a material which is resilient and resistant to material fatigue during cycled flexures to and from a testing position shown in FIGS. 3 and 4. In the flexed state, the end surfaces 22a of the free ends 22 make electrical connection to the associated pins 24. Spacer rods 30,30 are secured between the rows 16a and 16b and rows 16c and 16d. The rods 30,30 insure the desired spacing between the contacts during the flexural movement developed a lateral force (typically delivered by a cam, not shown) applied in a direction indicated by the arrows 32,32 in FIG. 3.

A principal feature of the present invention is the set of conductive plates 18a ... 18d each of which is associated with one row of the contacts 16. The plates 18a .. . 18d are preferably generally rectangular and are secured at a lower edge 34 to the base 14 with the edge passing through a suitable opening in the base 14. A flanged portion 36 of each plate extends under and is generally parallel to the base 14 provides an electrical connection site to ground (for plates 18a and 18d). The inner plates 18b and 18c also preferably have a flange-like portion 37 that is generally similar to the flange 36 except that it extends along the upper surface of the base 14. The flanges 37,37 provide electrical connection to ground for the plate 18c and to a source of a large current surge for the plate 18b. The plates are formed of a conductive sheet material that is resilient and has a substantially uniform thickness. Each of the plates is also oriented so that it is substantially parallel to the associated row of contacts and is closely spaced therefrom at a substantially constant distance. The plates extend vertically over substantially the full length of the contacts with a small clearance between the upper edge of the "inner" plates 18b and 18c and the overlying upper portions 22 of the "inner" rows of contacts 16b and 16c. Each plate extends laterally at least the full length of the row of contacts with which it is associated. For any contact, the associated plate is an approximation to a parallel plate with unlimited dimensions.

In the preferred form shown, a thin layer 38 of a flexible insulating material such as a fluoroplastic maintains each plate at the preselected spacing from the associated row of contacts. The layers 38 should have a sufficient Shore hardness that the lateral flexural force (in direction of the arrows 32,32) does not compress the layers 38 to any significant degree and thereby substantially reduce the spacing between the plates and their associated rows of contacts. On the other hand, the layers 38 should be sufficiently flexible not to impede significantly the flexural movement. Similarly, the plates themselves should be sufficiently flexible that they do not significantly impede flexural movement under the lateral flexing force applied through insulating rods 40,40 held at the outer face of the plates 18a and 18d at a point aligned with the rods 30,30. The layers 38 preferably extend substantially the full height of the plates to provide a generally uniform dielectric constant between the plates and the associated rows of contacts. The plate-contact spacing can also be maintained by other means such as small, non-resilient spacer elements with air as the principal insulating medium.

Each contact conducts a signal along its length from a connection point to a testing circuit at its lower end 20 adjacent the spacer 28 to its end 22 in contact with the associated pin 24 of the IC 26. As with any conductor, each contact has a characteristic inductance L which is a function of its cross-sectional area and length. For a conductor having a generally rectangular cross section such as the contacts 16 the inductance is a function of the thickness of the contacts (measured generally in the direction of the arrows 32,32), the width W of the contacts (measured along the direction of the rods 30,30) and the length 1 of the contact. When a fast-rising signal is launched the contact contacts having any significant length (a typical length being approximately one inch) will generate an inductive reactance $X_L$ which is equal to $2\pi fL$. The precise inductive impedance generated will, of course, depend upon the configuration of the conductor and the exact nature of the fast-rising signal. Since, as noted above, a fast-rising signal can be analyzed as a collection of waves having an extremely high frequency (a typical frequency being 300 mHz) even the extremely small inductance of a contact 16 can produce a sufficient inductive reactive to introduce distortions and reflections in the transmitted signal.

Figure 5:
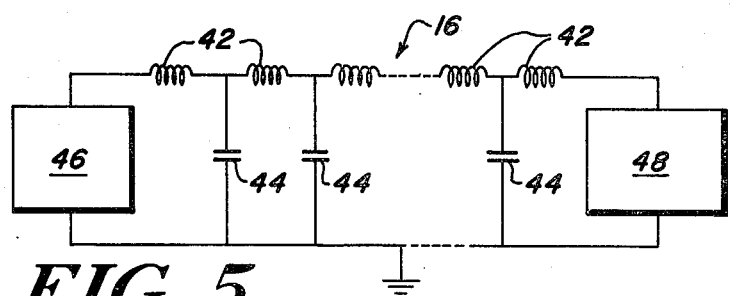
FIG. 5 is a circuit schematic for one contact and its associated plate.

The plates of the present invention neutralize this inductive reactance by providing a distributed capacitance along the length of the contacts. This equivalent circuit for a single contact is shown in FIG. 5 where a contact 16 is represented as a series of inductors 42 and the distributed capacitance between the contact and the associated plate is represented as a series of capacitors 44 connected between the inductors 42 and ground. The signal source or test circuitry 46 is connected at one end of the circuit and the IC 26, represented as a load 48, is connected at the opposite end. Utilizing conventional transmission line theory and formulas for calculating inductance and capacitance of the contacts 16 and associated plates 18, for a given contact and a given test signal, it is possible to calculate the plate-contact spacing and that will produce a distributed capacitance whose capacitive $X_c$ offsets the phase shift of the inductive reactance $X_L$. As a result, the fast-rising signal transmitted by the contacts 16 encounter a "characteristic" impedance $Z_o$, that is substantially resistive. That is, there is no net phase shift between the current and voltage due to capacative or inductive elements in the transmission line. The impedance $Z_o$ is, therefore, substantially independent of the frequency of the signal and the test contactor assembly 12 is broad band.

Typically the IC's 26 are tested in systems where the impedance of the contactor assembly is either 50 ohms or 100 ohms. The contactor assembly 12 of the present invention therefore preferably has plates 18a ... 18d that are structured and located with respect to the contacts 16 to produce a characteristic impedence with one of these values. The value of $Z_o$ in ohms is given by the square root of L/C. Of course, the inductance of the contacts or the capacitance introduced by the plates 18 can be designed to produce a value for the characteristic impedance encountered by the signal which is less than 50 ohms, more than 100 ohms, or at some intermediate value.

While calculations can provide a reasonably good indication of performance, particularly when the elements are rigid and fixed and the insulating medium is air, for the contactor assembly of this invention trial and error adjustments will usually be required to arrive at a configuration that produces the desired characteristic impedance. It should be noted that because pairs of contacts forming a Kelvin contact are connected to the same pin and carry the same signal, as a practical matter the capacitance between the pair is not significant. However, the capacitance between laterally adjacent contacts is important. To reduce this capacitance, it may be preferable for certain applications to use a single contact for each pin rather than a Kelvin pair. For a typical Kelvin contact assembly of the type used in testers/handlers manufactured by Daymarc Corporation, and for use with fast rising signals that have a change in potential of 5 volts over 1 nanosecond, it has been found that a plate-contact spacing of approximately 0.014 inch produces the desired response.

Another significant feature of the contactor assembly according to the present invention is that the inner plates 18b and 18c include pin contact elements 50 and 52, respectively, mounted on their faces adjacent the IC 26 and positioned to make contact with an associated pin 24 of the IC. The contacting elements 50 and 52 are L-shaped conductors which are welded or brazed onto the inner plates. They are useful for testing the operation of the IC in response to a large current surge. One of the inner plates, such as the plate 18b, is preferably connected to a source of a suitable large current surge (such as a capacitor, not shown) which can be applied to the IC through the plate 18B and the contact 50. It should be noted that due to the large dimensions of the plate 18b as compared to a single contact 16, the inductive impedance problems usually associated with a large current surge are minimized. The contact 52 is connected through the plate 18c to ground, as are the plates 18a and 18d.

Figure 6:
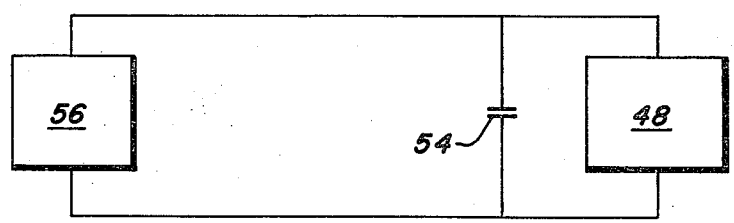
FIG. 6 is a circuit schematic for the inner capacitive plates as shown in FIGS. 1-3.
Figure 7:
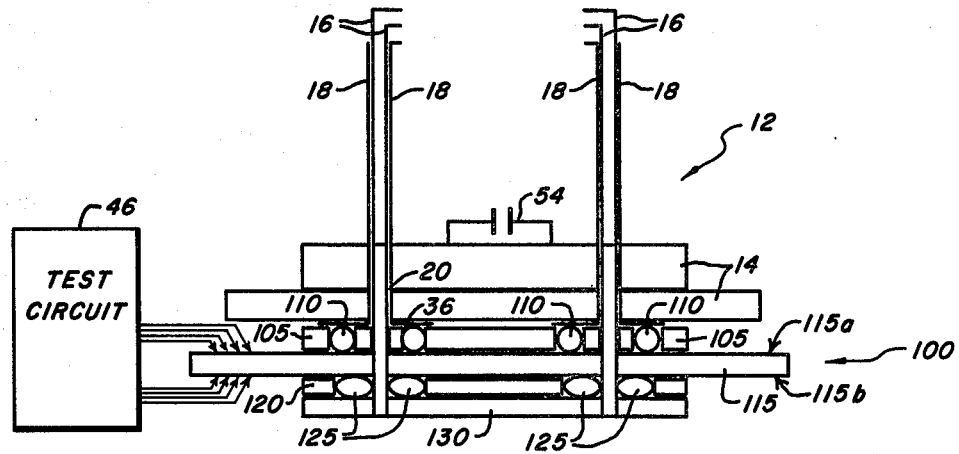
FIG. 7 is a diagrammatic view of an interface assembly constructed according to the present invention in operative combination with the contactor assembly shown in FIGS. 1-4.

The plates 18b and 18c are also connected to one another through a small capacitor 54. The function of the capacitor 54 is best seen with reference to FIG. 6. The source of the large current surge is represented by the reference numeral 56. The IC appears as a load with the capacitor 54 connected in parallel with the load. Because the capacitance is low, it presents a very low impedance to ground. As a result, even though the plate 18b is connected to a high voltage source, for fast-rising signals it acts as though it is at ground. Another advantage of this arrangement is that it provides a source for a large current surge that is located very close to the device being tested. This also results in reductions in distortions in the transmission and increases the accuracy of the test results.

Figure 1:
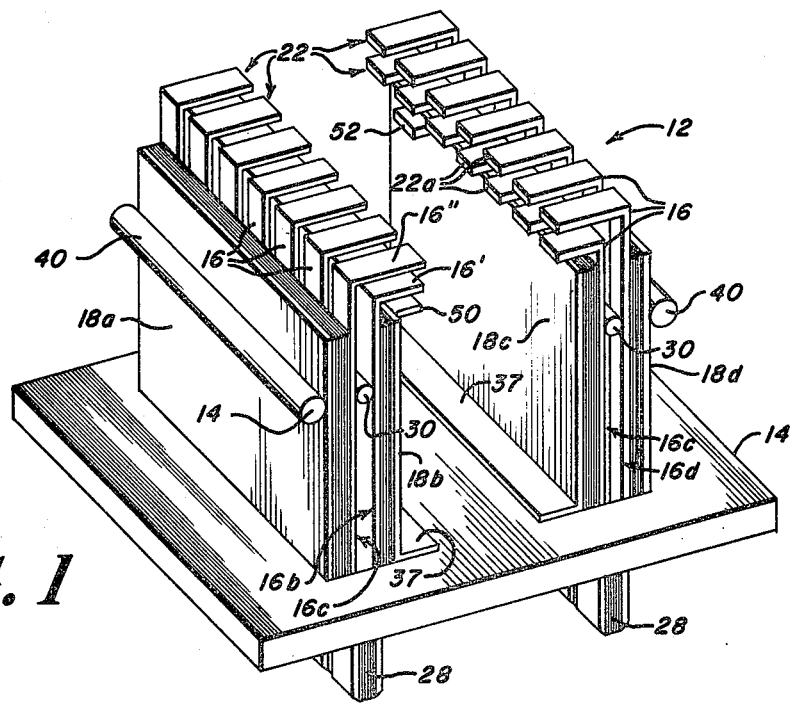
FIG. 1 is a perspective view of a broad band contactor assembly constructed according to the present invention and utilizing two opposing rows of double Kelvin contacts suitable for testing a DIP IC's.
Figure 3:
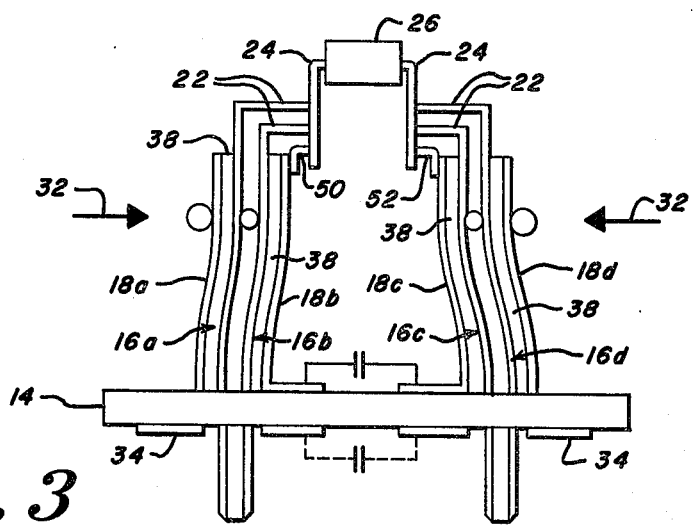
FIG. 3 is a simplified view corresponding to FIG. 2 showing the contacts and the associated capacitive plates flexed into a position where the contacts are in electrical connection with a device being tested.
Figure 4:
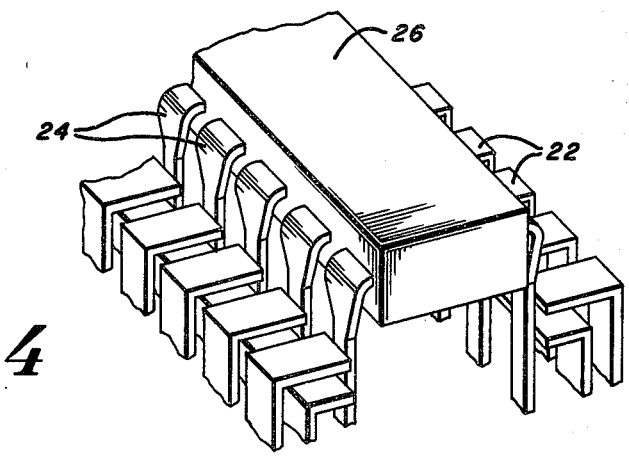
FIG. 4 is a detailed perspective view of the free ends of the contacts making electrical connection with a representative IC as shown in FIG. 3.

The capacitor 54 is shown in FIGS. 1 and 3 as connected between the flanges 37 and located at the upper surface of the base 14. This location has the advantage of placing the capacitor 54 very close to the IC 26. However, in certain test situations it is necessary to place the IC and components near the IC in a temperature environment that adversely affects the capacitor. In these instances, the capacitor 54 can be connected between the flanges 36,36 of the plates 18b, 18c located at the under side of the base 14 (shown in phantom). This location provides temperature isolation for the capacitor 54 without significantly increasing the distance between the IC and the capacitor.

Figure 8:
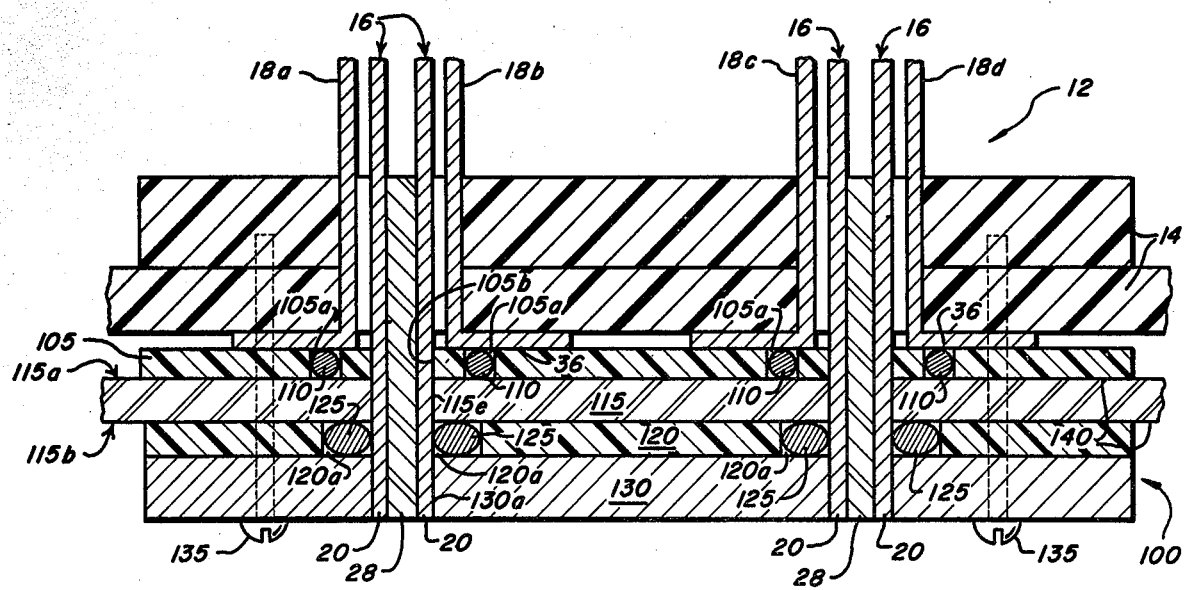
FIG. 8 is a detailed sectional view with portions broken away of the interface assembly shown in FIG. 7.
Figure 11:
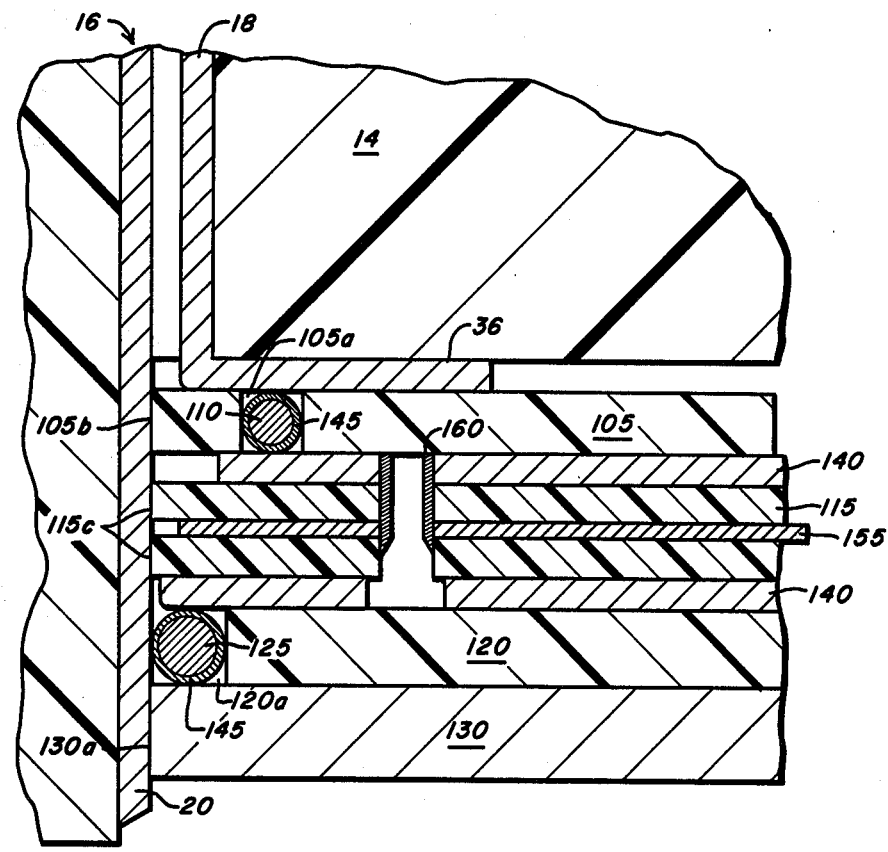
FIG. 11 is a detailed view in vertical section of the interface assembly of the type shown in FIGS. 7-10 except that the contactor board includes an internal metallic ground layer.

With reference to FIGS. 7-11, the contactor assembly 12 is connected to the test circuit 46 through an interface assembly 100 located immediately below the base 14 of the contactor assembly 12. The interface assembly 100 has an upper connector frame 105, upper elastomeric connectors 110, a contactor board 115, a lower connector frame 120, lower elastomeric connectors 125, and a connector clamp plate 130. The upper connector frame 105 is held between the base of the contactor assembly 12 and the top of the contactor board 115. The lower connector frame 120 is held underneath the contactor board 115 and on top of the clamp plate 130. The interface assembly 100 has a sandwich-like construction as is best seen in FIGS. 8, 9 and 11.

The upper elastomeric connectors 110 are received in openings 105a in the upper connector frame 105. The lower elastomeric connectors 125 are received in openings 120a in the lower connector frame 120. The cross-sectional dimensions of the connector 110 and 125 are such that they extend slightly above and below the associated opening 105a or 120a. When the assembly 100 is clamped together, these protrusions are compressed to generate a resilient spring force that urges the connectors into contact with the adjacent overlying and underlying components in the assembly. It should be noted that the openings in the upper connector frame 105 for the upper elastomeric connectors 110 are spaced a small distance away from the openings for the lower ends 20 of the contacts 16 to insure that the upper elastomeric connectors make an electrical connection with a plate 18 rather than a contact 16. Also, the thickness of the frames 105, 120 in relation to the cross-sectional dimensions of the elastomeric connectors 110, 125 controls the degree of deformation of the connector when they are clamped, and hence controls the resilient force establishing the desired electrical connections and the amount of shear stress applied to conductive filaments 145 carried on the outer surface of the connector.

The lower ends 20 of the contacts 16 are received by and located in the interface assembly by a set of aligned openings 105b, 115c, 120a and 130a in the upper connector frame 105, the contactor board 115, the lower connector frame 120 and the connector clamp plate 130, respectively. Screws 135 pass freely through the connector clamp 130, the lower connector frame 120, the contactor board 115, and the upper contactor frame 105 into suitably aligned threaded holes in the lower surface of the base member 14 of the contactor assembly. The screws secure the interface assembly to the contactor assembly and clamp the component members of the interface assembly to one another. This clamping generates the compression force of the elastomeric connectors.

The contactor board 115 carries a pattern of conductive stripes 140 on its top and bottom faces 115a and 115b. The stripes are formed using conventional printed circuit board techniques. Each stripe is electrically insulated from adjoining stripes and makes electrical connection at one end to a connection element of the test circuit and at the other end to a contact or other electrically conductive member of the contactor assembly 12. A given contactor board carries a stripe pattern that "leads" a given test signal to an associated contact 16. To accommodate different IC's, it is usually only necessary to change the contactor board 115 and thereby establish a different set of electrical connections.

The upper and lower elastomeric connectors 110 and 125 are elongated members formed of a resilient, insulating material. They are generally aligned with the rows of contacts 16. The outer surface of each connector 110, 125 carries a large number of narrow, mutually spaced conductive filaments 145. Each conductive filament is oriented generally perpendicular to the longitudinal axis of the connector and preferably circumscribes the connector. The elastomeric connectors can have a generally circular cross section, as shown in FIG. 10A, or other shapes such as a rectangular cross section shown in FIG. 10B. Suitable elastomeric connectors of this type are commercially available.

Each upper elastomeric connector 110 establishes a unique electrical connection between a conductive stripe 140 on the top face 115a of the contactor board 115 and an associated flanged portion 36 of a plate 18. Each lower elastomeric connector 125 establishes a unique electrical connection between a conductive stripe 140 on the bottom face 115b of the board 115 and the lower end 20 of an associated contact 16. The signal launched by the test circuitry thus goes from a conductive stripe on the contactor board 115 to one or more conductive filaments 145 on an upper or lower elastomeric connector and then to a contact or plate of the contactor assembly. A significant advantage of the present invention is that with the structural features described above, once the contactor board is located on the contactor assembly, the elastomeric connectors will establish the desired electrical connections reliably and without critical alignments, complex connection fixtures, or point-to-point "hard" wiring.

As shown in FIG. 11, the contactor board 115 can contain an internal conductive path, preferably a metallic layer 155 sandwiched in the middle of the contactor board 115. This layer usually extends laterally at least as far as the patterns of stripes on the faces 115a and 115b and functions as a ground plane. Conventional plated-through holes 160 extending from the top or bottom face of the contactor board to the metal plate provide an electrical connection path from the exterior of the board 115 to the interior layer 155. Electrical signals travel from the plate 155 through the plated-through holes 160 to a conductive stripe 140 on the contactor board 115 and then to a conductive filament 145 on an upper or lower elastomeric connector to a contact or plate of the contactor assembly. One such plated-through hole 160 is shown in FIG. 11 extending from the layer 155 to the stripe 140 on the upper surface 115a. (It should be noted that the thickness of the stripe 140 is highly exaggerated in FIG. 11.) Also, while one layer 155 is shown in FIG. 11, two or more layers can be used. In addition to providing a ground connection, the layer 155 also functions with respect to the stripes 140 in the same manner as the plates 18 with respect to the contacts 16. More specifically, the dimensions and spacing of the layer or layers 155 is selected to produce a distributed capacitance that results in the interface assembly presenting a substantially characteristic or purely ohmic impedance to a fast rising test signal carried by the stripes 140. Further, this function of the layer 155 can be performed by a metallic layer formed on an outer surface of the contactor board 115. Therefore, for the purpose of this application the term "pattern of conductive stripes" includes the situation where this "pattern" is substantially a continuous metallic layer.

The interface assembly of the invention provides a high density of electrical connections in a confined area while at the same time providing excellent signal transmission characteristics. It is also important that it establishes the required electrical connection between the test circuitry and the contacts or other components of the contactor assembly without critical alignments. In particular, it avoids precise point to point alignment of a contact with pin and socket connectors. Because the contacts are not soldered to the board, the same interface assembly that is used with Kelvin contacts can be used with single contacts. Also, if an integrated circuit with a different pin assignment needs to be tested, parts of the interface assembly can be interchanged. The elastomeric connectors and the same contactor assembly can be used with a different contactor board to test the new device. This separability of the mechanical and electrical portions of the system results in a significant reduction in the test components needed in inventory.

While the invention has been described with reference to its preferred embodiment, we understood that various modifications and alterations will occur to those skilled in the art from the foregoing detailed description and the drawings. For example, while the invention has been described with respect to continuous plates the capacitive function of the plates can be performed by a series of conductive strips which are each associated with the contacts (see FIG. 11) or by non-rectangular plates which are not necessarily continuous. Further, while the plates 18 have been described generally resilient members that are secured at one edge to the base 14, it is possible to produce the desired operating characteristics of the present invention utilizing substantially generally inflexible plates and plates which are not secured to the base. One embodiment could utilize a plate which is fastened by an adhesive to the associated layer 38 but is not directly secured to the base 14. Also, the elastomeric connectors are described as having conductive filaments that circumscribe the connector laterally. The same function can be achieved with open loop filaments provided that they extend a sufficient distance to make the desired electrical connection. These and other modifications and variations which will occur to those skilled in the art are intended to fall within the scope of the appended claims.

What is claimed and desired to be secured by Letters Patent is:

1. A system for establishing an accurate and reliable electrical connection between a test circuit and a plurality of connection pins of an integrated circuit device arrayed in at least one row, comprising
   a contactor assembly comprising,
      a base formed from an insulating material,
      a plurality of contacts arrayed in at least one row with a lower end of each contact secured to said base and an upper end adapted to make electrical connection with one of the pins, each of said contacts being flexible to move between a first position where said upper ends are spaced from said pins and a second position where said upper ends are in electrical connection with said pins, each of said contacts being adapted to conduct an electrical signal along its length to an associated pin of the device,
      plate means secured in a closely spaced, generally parallel relationship with said at least one row of contacts, the dimensions of said plate means and said spacing producing a distributed capacitive reactance in said contacts produced by the presence of said plate means generally offsets the inductive reactance produced by said signal in said contacts whereby said signals encounter a generally characteristic impedance over a broad band, and
   an interface assembly comprising:
      a contactor board with a pattern of conductive stripes carried on at least one face,
      at least one elongated elastomeric connector with mutually spaced conductive filaments oriented generally perpendicular to the longitudinal axis of said connector and carried on its outer surface, and
      means for securing said elastomeric connector, said contactor board and said contactor assembly in a fixed spatial relation with each other whereby said elastomeric connector establishes an electrical connection between a conductive stripe on the contactor board and one of said contact or plate means of said contactor assembly.

2. The system of claim 1 wherein said contacts are double Kelvin contacts arrayed in four generally parallel rows and uniformly spaced along the direction of said rows, and wherein said plate means comprises an inner and outer plate associated with each row of said Kelvin contacts.

3. The system of claim 2 wherein said plate means is located generally between said pins and said contacts and further comprising contact means secured to said plate means and adapted to establish an electrical connection with one of the pins when said contacts are in said second position.

4. The system of claim 3 wherein said plate means are electrically connected to one another through a small capacitor.

5. The system of claims 1 or 2 wherein said securing means comprises:
   an upper connector frame located between said base and said connector board, a lower connector frame located immediately below said contactor board, and means for clamping said contactor board, said electomeric connectors, and said upper and lower connector frames to one another and to said contactor assembly.

6. The system of claim 5 wherein said clamping means comprises a connector clamp plate located below said lower connector frame, and clamping screws which pass freely through said connector clamp plate, said lower connector frame, said contactor board, and said upper connector frame into aligned threaded holes in said base member.

7. The system of claim 5 wherein said upper and lower connector frames include openings that each receive and locate one of said elastomeric connectors.

8. The system of claim 1 or 2 wherein said contactor board has at least one internal conductive path.

9. The system of claim 8 wherein said internal conductive path comprises a metallic layer.

10. The system of claim 9 wherein said metallic layer is located and dimensioned with respect to said pattern of conductive stripes to provide a distributed capacitance with respect to said pattern of conductive stripes such that a fast-rising signal carried by said conductive stripes encounters a substantially characteristic impedance.

11. The system of claim 8 further comprising means for establishing an electrical connection between said internal conductive path and a portion of said pattern of conductive stripes formed on at least one exterior face of said contactor board.

* * * * *